(12) United States Patent
Kurz et al.

(10) Patent No.: US 8,609,485 B2
(45) Date of Patent: *Dec. 17, 2013

(54) METHODS OF FORMING EFUSE DEVICES

(75) Inventors: Andreas Kurz, Dresden (DE); Andy Wei, Dresden (DE); Christoph Schwan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 182 days.

This patent is subject to a terminal disclaimer.

(21) Appl. No.: 12/941,185

(22) Filed: Nov. 8, 2010

(65) Prior Publication Data

US 2011/0241124 A1   Oct. 6, 2011

(30) Foreign Application Priority Data

Mar. 30, 2010 (DE) .................. 10 2010 003 454

(51) Int. Cl.
*H01L 21/8238* (2006.01)
(52) U.S. Cl.
USPC .................. 438/215; 257/E23.149; 257/529; 438/601
(58) Field of Classification Search
USPC ......... 438/379, 381, 132, 215, 281, 333, 467, 438/601; 257/529, E21.09, E23.149, 257/E21.592
See application file for complete search history.

(56) References Cited

U.S. PATENT DOCUMENTS

| 7,329,911 | B2 | 2/2008 | Okayama | 257/209 |
| 8,486,768 | B2 * | 7/2013 | Kurz et al. | 438/132 |
| 2002/0102755 | A1 * | 8/2002 | Marr et al. | 438/22 |
| 2007/0082431 | A1 * | 4/2007 | Hoefler et al. | 438/128 |
| 2008/0203427 | A1 | 8/2008 | Mowry et al. | 257/190 |
| 2011/0156857 | A1 * | 6/2011 | Kurz et al. | 337/414 |
| 2012/0001295 | A1 * | 1/2012 | Kurz et al. | 257/529 |

FOREIGN PATENT DOCUMENTS

| DE | 102007009915 A1 | 10/2008 | H01L 29/78 |
| WO | WO 2007/047165 A2 | 4/2007 | H01L 21/82 |

OTHER PUBLICATIONS

Translation of Official Communication from German Patent Office for German Patent Application No. 10 2010 003 454.1 dated Jan. 13, 2011.

* cited by examiner

*Primary Examiner* — Bilkis Jahan
(74) *Attorney, Agent, or Firm* — Williams, Morgan & Amerson, P.C.

(57) ABSTRACT

A semiconductor-based electronic fuse may be provided in a sophisticated semiconductor device having a bulk configuration by appropriately embedding the electronic fuse into a semiconductor material of reduced heat conductivity. For example, a silicon/germanium fuse region may be provided in the silicon base material. Consequently, sophisticated gate electrode structures may be formed on the basis of replacement gate approaches on bulk devices substantially without affecting the electronic characteristics of the electronic fuses.

10 Claims, 6 Drawing Sheets

METHODS OF FORMING EFUSE DEVICES

BACKGROUND OF THE INVENTION

1. Field of the Invention

The present disclosure generally relates to the field of fabricating integrated circuits, and, more particularly, to forming electronic fuses for providing device-internal programming capabilities in complex integrated circuits.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance. In addition to the large number of transistor elements, a plurality of passive circuit elements, such as capacitors, resistors and the like, are typically formed in integrated circuits, that are used for a plurality of purposes.

Due to the decreased dimensions of circuit elements, not only the performance of the individual transistor elements may be improved, but also their packing density may be increased, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

In such modern integrated circuits, minimal features sizes have now reached approximately 50 nm and less, thereby providing the possibility of incorporating various functional circuit portions at a given chip area, wherein, however, the various circuit portions may have a significantly different performance, for instance with respect to lifetime, reliability and the like. For example, the operating speed of a digital circuit portion, such as a CPU core and the like, may depend on the configuration of the individual transistor elements and also on the characteristics of the metallization system, which may include a plurality of stacked metallization layers so as to comply with a required complex circuit layout. Thus, highly sophisticated manufacturing techniques may be required in order to provide the minimum critical feature sizes of the speed critical circuit components. For example, sophisticated digital circuitry may be used on the basis of field effect transistors which represent circuit components in which the conductivity of a channel region is controlled by a gate electrode that is separated from the channel region by a thin dielectric material. Performance of the individual field effect transistors is determined by, among other things, the capability of the transistor to switch from a high impedance state into a low impedance state at high speeds, wherein a sufficiently high current may also have to be driven in the low impedance state. This drive current capability is determined by, among other things, the length of the conductive channel that forms in the channel region upon application of an appropriate control voltage to the gate electrode. For this reason and in view of the demand for increasing the overall packing density of sophisticated semiconductor devices, the channel length and thus the length of the gate electrode is continuously being reduced which, in turn, may require an appropriate adaptation of the capacitive coupling of the gate electrode to the channel region. Consequently, the thickness of the gate dielectric material may have also to be reduced in order to maintain controllability of the conductive channel at a desired high level. However, the shrinkage of the gate dielectric thickness may be associated with an exponential increase of the leakage currents, which may directly tunnel through the thin gate dielectric material, thereby contributing to enhanced power consumption and thus waste heat, which may contribute to sophisticated conditions during operation of the semiconductor device. Moreover, charge carriers may be injected into the gate dielectric material and may also contribute to a significant degradation of transistor characteristics, such as threshold voltage of the transistors, thereby also contributing to pronounced variability of the transistor characteristics over the lifetime of the product. Consequently, reliability and performance of certain sophisticated circuit portions may be determined by material characteristics and process techniques for forming highly sophisticated circuit elements, while other circuit portions may include less critical devices which may thus provide a different behavior over the lifetime compared to critical circuit portions. Consequently, the combination of the various circuit portions in a single semiconductor device may result in a significant different behavior with respect to performance and reliability, wherein the variations of the overall manufacturing process flow may also contribute to a further discrepancy between the various circuit portions.

For these reasons, in complex integrated circuits, frequently, additional mechanisms may be implemented so as to allow the circuit itself to adapt performance of certain circuit portions to comply with performance of other circuit portions, for instance upon completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, resetting overall circuit speed and the like.

For this purpose, so-called electronic fuses or e-fuses may be provided in the semiconductor devices, which may represent electronic switches that may be activated once in order to provide a desired circuit adaptation. Hence, the electronic fuses may be considered as having a high impedance state, which may typically also represent a programmed state, and may have a low impedance state, typically representing a non-programmed state of the electronic fuse. Since these electronic fuses may have a significant influence on the overall behavior of the entire integrated circuit, a reliable detection of the non-programmed and the programmed state may have to be guaranteed, which may have to be accomplished on the basis of appropriately designed logic circuitry. Furthermore, since typically these electronic fuses may be actuated once over the lifetime of the semiconductor device under consideration, a corresponding programming activity may have to ensure that a desired programmed state of the electronic fuse is reliably generated in order to provide well-defined conditions for the further operational lifetime of the device.

For these reasons, appropriate mechanisms have been established to provide electronic fuses that may be programmed in a reliable manner. The programming of electronic fuses may rely on a degradation mechanism of a conductive material, wherein, upon applying a current pulse, an irreversible change of the electronic characteristics of the electronic fuse may result in a reliably detectable programming status of the electronic fuse. To this end, electromigration, typically a non-desired effect in semiconductor devices, may be taken advantage of in order to provide a mechanism for permanently damaging the conductive line and thus achieving a detectable high impedance state. Electromigration is a phenomenon that can be observed in conductors in which a sufficiently high current density may be established such that a directed diffusion of electrons in the conductor material may result in a material migration caused by the momentum transfer from the electrons to the atoms or ions of the material. Electromigration can typically be observed in conductor lines of semiconductor devices in which the conductive lines are embedded in a dielectric material that provides sufficient heat dissipation capability, thereby enabling very high current densities before excessive heat in the conductive line may result in an irreversible damage, as may typically be observed in isolated conductors. Thus, although embedding the conductive lines in dielectric materials may allow operation of the semiconductor devices with high current densities, the material migration in the conductive lines caused by the momentum transfer of electrons may finally result in a degradation and thus failure of the conductive line during the operational lifetime of the semiconductor device. For this reason, electromigration effects in metallization systems of semiconductor devices are carefully studied and monitored in order to estimate performance and reliability of complex semiconductor devices. Electromigration, on the other hand, may be efficiently used in electronic fuses in order to intentionally initiate a degradation of a conductive line or fuse body so as to obtain a detectable high impedance state. To this end, the electromigration in metal silicide materials formed in silicon-based materials, such as polysilicon materials, may be efficiently used for providing electronic fuses in the device level of semiconductor devices, wherein the overall lateral dimensions and the material composition of the basic semiconductor material in combination with the characteristics of the metal silicide may thus have a significant influence on the overall performance of a corresponding electronic fuse. To this end, in addition to appropriate designs and layouts of corresponding electronic fuses based on silicon material and metal silicide, appropriate peripheral circuitry has been developed, for instance in the form of transistor elements for driving the required current pulse through the electronic fuse so as to blow the fuse upon programming the electronic fuse, wherein the current drive capability of the transistor or transistors and thus the size thereof may have to be adapted to the current density required for programming the electronic fuse.

Upon further reducing the overall dimensions of circuit elements in sophisticated semiconductor devices, the gate length of field effect transistors, which represent one important circuit element in complex semiconductor devices, is reduced, thereby requiring efficient mechanisms for controlling the current flow in the channel region of the field effect transistors, as discussed above. Conventionally, electrode structures may be provided on the basis of a polysilicon material in combination with a metal silicide formed therein, which may be provided on an appropriate gate dielectric material, such as silicon dioxide, which separates the gate electrode from the channel region. In order to provide a very efficient overall manufacturing process flow, the electronic fuses may be formed together with the gate electrode structures of the transistors since, as discussed above, polysilicon in combination with a metal silicide may provide an efficient mechanism for electronic fuses. With the introduction of gate lengths of 40 nm and less, however, it turns out that conventional gate electrode structures based on polysilicon in combination with conventional gate dielectrics, such as silicon dioxide, silicon oxynitride and the like, may no longer be sufficient for appropriately controlling the channel in sophisticated field effect transistors. For this reason, conventional gate dielectric materials may be replaced, at least partially, by so-called high-k dielectric materials, i.e., dielectric materials having a dielectric constant of 10.0 or higher, in order to provide a sufficient capacitive coupling of the gate electrode to the channel region without further increasing the resulting gate leakage currents. Concurrently, the polysilicon material may be replaced by a material of superior conductivity, which may also significantly reduce or avoid the creation of a depletion zone in the vicinity of the gate dielectric material. Consequently, a plurality of manufacturing strategies have been developed, one of which may be referred to as a gate replacement approach. In this very promising manufacturing technique, the gate electrode structure may initially be formed on the basis of polysilicon in combination with a conventional gate dielectric material or on the basis of a high-k dielectric material and the processing may be continued by completing the basic transistor configuration, i.e., forming drain and source regions and the like. In a very advanced manufacturing stage, the gate electrode structures may be embedded in a dielectric material and the polysilicon material may be removed by appropriate selective etch strategies. Thereafter, any appropriate metal species may be formed in the resulting gate openings in order to adjust the appropriate gate characteristics in terms of work function, conductivity and the like.

Although this manufacturing strategy may provide superior field effect transistors having high-k metal gate electrode structures, at the same time, the polysilicon material of non-transistor elements may be removed, such as the semiconductor material of the electronic fuses, which is then replaced by a highly conductive electrode metal, thereby, however, significantly changing the overall electronic behavior of the electronic fuses. That is, due to the superior conductivity, increased current densities may be required, which in turn may be associated with the provision of transistors of significantly increased size in order to provide the required high current values. On the other hand, reducing the overall lateral dimensions of the electronic fuses may be less than desirable, since typically it is extremely difficult to further reduce the critical dimensions in the device level on the basis of given lithography and patterning abilities of the circuit design under consideration.

In view of this situation, other strategies have been developed, such as providing the electronic fuses in the metallization system of the semiconductor device, which, however, may suffer from similar problems with respect to the required high current densities, due to the superior conductivity of the metal lines and vias in the metallization system of sophisticated semiconductor devices. In other approaches, electronic fuses may be formed in the active semiconductor layer, i.e., in the crystalline semiconductor material, in which the drain and source regions of the transistor elements may also be provided. In this manner, the gate replacement approach does not interfere with the electronic characteristics of the electronic fuses formed in the active semiconductor layer, wherein, however, it has been observed that corresponding electronic fuses may not efficiently operate in bulk configurations, that is, in semiconductor devices in which the active semiconductor material may be formed directly on the crystalline semiconductor material of the substrate without providing a buried insulating material, as is the case in a silicon-on-insulator (SOI) configuration.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which a semiconductor-based electronic fuse may be provided in the active semiconductor material of a bulk device, i.e., of a semiconductor device that may initially not comprise a buried insulating material, wherein the electronic fuse may be provided on the basis of a metal silicide material or any other appropriate semiconductor/metal compound that may be formed so as to be in contact with semiconductor material having a reduced heat conductivity. Without intending to restrict the present application to the following explanation, it is nevertheless assumed that the superior heat conductivity of a semiconductor base material, such as a silicon material, may be inappropriately high in a bulk configuration so as to allow an efficient electromigration effect in the metal silicide material when being in direct contact with the initial base material having the superior heat conductivity. That is, in a bulk configuration, the semiconductor material or layer in which transistor elements and also the electronic fuses are to be provided may represent an upper portion of the crystalline material of the semiconductor material, thereby providing an efficient thermal coupling to the fuse body of the electronic fuse. Consequently, upon generating a high current pulse and thus high current density in the metal silicide material, and to a lesser degree in the semiconductor material, the heat generated therein may be efficiently dissipated and may thus reduce the electromigration effect, since electromigration is also strongly influenced by the local thermal conditions. That is, a high local temperature may significantly increase the overall electromigration effect and thus the degradation of the conductive line, which may be highly advantageous in electronic fuses. Thus, by appropriately reducing the initial heat conductivity of the semiconductor base material, for instance of silicon, an increased degree of thermal decoupling of the actual fuse area and, in particular, of the metal silicide or metal/semiconductor compound area may be achieved, thereby providing higher local temperatures and thus an increased electromigration effect. Consequently, electronic fuses may be efficiently implemented in the active semiconductor material without requiring the thermal decoupling effect of a buried insulating material, thereby enabling the application of sophisticated manufacturing techniques in bulk semiconductor devices, such as gate replacement approaches and the like.

In some illustrative aspects disclosed herein, the reduction of the heat conductivity of the initial base semiconductor material may be accomplished by replacing an appropriate portion of the semiconductor base material with a semiconductor material of reduced heat conductivity, such as silicon/germanium and the like, which may be accomplished on the basis of any appropriate process strategy.

One illustrative method disclosed herein relates to forming an electronic fuse of a semiconductor device. The method comprises replacing a portion of a first semiconductor material with a second semiconductor material, wherein the first semiconductor material forms a bulk configuration with a substrate material of the semiconductor device. Furthermore, the first semiconductor material has a first heat conductivity that is greater than a second heat conductivity of the second semiconductor material. The method further comprises forming a mask so as to define lateral dimensions of the electronic fuse in the second semiconductor material. Additionally, the method comprises forming a metal silicide material of the electronic fuse by using the mask as a silicidation mask.

A further illustrative method disclosed herein relates to forming a semiconductor device. The method comprises reducing a heat conductivity of a semiconductor base material locally in a fuse region, wherein the fuse region forms a bulk configuration with a substrate material of the semiconductor device. Additionally, the method comprises forming a metal silicide material in the fuse region so as to provide a first contact area, a second contact area and an intermediate fuse area of an electronic fuse.

One illustrative semiconductor device disclosed herein comprises a semiconductor base material forming a bulk configuration with a crystalline substrate material of the semiconductor device, wherein the semiconductor base material has a first heat conductivity. The semiconductor device further comprises a semiconductor region in contact with the semiconductor base material and having a second heat conductivity that is less than the first heat conductivity. Moreover, the semiconductor device comprises a metal silicide formed in the semiconductor region so as to provide a first contact area, a second contact area and a fuse area of an electronic fuse.

BRIEF DESCRIPTION OF THE DRAWINGS

The disclosure may be understood by reference to the following description taken in conjunction with the accompanying drawings, in which like reference numerals identify like elements, and in which:

FIG. 1b schematically illustrates a top view of the semiconductor device of FIG. 1a;

Figure 1A:
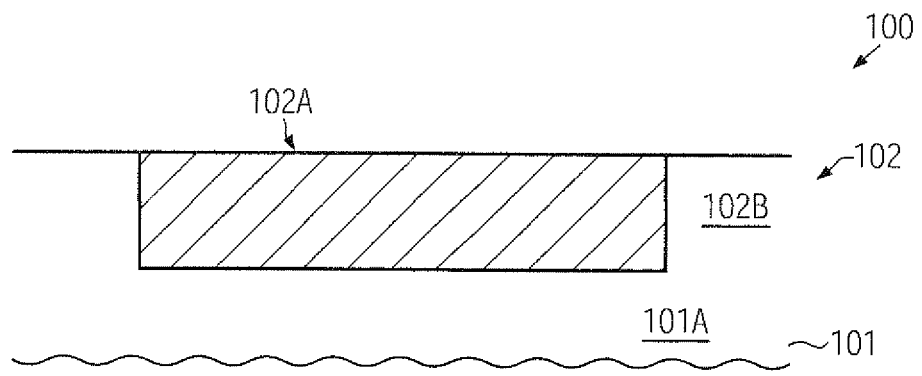
FIG. 1a schematically illustrates a cross-sectional view of a semiconductor device in which a semiconductor material of reduced heat conductivity is provided or embedded in a semiconductor base material, such as a silicon material, so as to form an electronic fuse in the semiconductor material of reduced heat conductivity, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which an electronic fuse may be formed within the semiconductor material of a semiconductor device without requiring a buried insulating material, as is the case in SOI configurations, which may be accomplished by providing a semiconductor region of reduced heat conductivity that may be embedded in the initial semiconductor base material. For example, the majority of complex integrated semiconductor devices are and will be in the foreseeable future formed on the basis of silicon material, which may thus represent one of the most frequently used semiconductor materials. Typically, in a bulk configuration, the actual silicon material may be provided on the basis of a silicon substrate, wherein, if required, an additional epitaxial silicon layer may be grown on the crystalline substrate material, thereby providing the active semiconductor layer, in and above which the transistor elements and also other non-transistor elements are to be formed. In a bulk configuration, the moderately high heat conductivity of silicon of approximately 150 W/mK may be an advantage in dissipating waste heat that may be created in sophisticated circuit portions, which, however, may not allow providing efficient electronic fuses in the silicon material unless extremely high current densities may have to be applied, which in turn require current drive transistors of great width, which may thus consume valuable chip area. To this end, an efficient heat decoupling mechanism may be implemented by reducing the heat conductivity of the initial semiconductor base material, such as the silicon material, which may be accomplished, in some illustrative embodiments, by replacing the semiconductor base material with a semiconductor material of reduced heat conductivity. For example, in some illustrative embodiments, a silicon-containing semiconductor compound or mixture may be provided so as to enable the formation of a metal silicide material in a further advanced manufacturing stage, while at the same time providing the desired reduced heat conductivity. For example, a silicon/germanium mixture with a germanium fraction of approximately 15-35 atomic percent or even higher may be used, thereby providing a semiconductor material having a reduced heat conductivity. For example, for the above-specified material composition of the silicon/germanium mixture, a heat conductivity of approximately 59 W/mK or somewhat higher may be achieved, which may thus provide the desired thermal resistivity compared to the highly conductive base material, such as silicon. Furthermore, upon providing the semiconductor mixture, any other desired characteristics, such as doping concentration and the like, may also be adjusted in view of obtaining the desired electronic characteristics of the electronic fuse to be formed on the basis of the semiconductor material of reduced heat conductivity.

The semiconductor material of reduced heat conductivity may be provided in the form of a substantially crystalline semiconductor material, which may be accomplished by applying epitaxial growth techniques after removing a specific portion of the initial base material, while, in other cases, any other deposition mechanism may be applied, for instance in the form of amorphous or polycrystalline semiconductor material, wherein, if desired, an additional dielectric material of reduced heat conductivity may be provided prior to the deposition of the semiconductor material. For example, silicon dioxide, silicon nitride and the like may be used in this situation if a crystalline material for the electronic fuse under consideration may not be required. In this case, an even further enhanced thermal decoupling from the surrounding semiconductor base material may be accomplished.

In other illustrative embodiments, appropriate atomic species, such as germanium, oxygen, nitrogen and the like, may be incorporated by ion implantation so as to appropriately modify the heat conductivity of the semiconductor base material, while, however, maintaining the desired electronic characteristics, for instance in terms of electric conductivity, capability of creating a metal silicide and the like.

Consequently, electronic fuses may be efficiently formed within the active semiconductor material, thereby providing superior flexibility in applying further manufacturing strategies, for instance for forming sophisticated transistor elements on the basis of replacement gate approaches and the like.

FIG. 1a schematically illustrates a cross-sectional view of a semiconductor device 100 comprising a substrate 101 and a semiconductor layer 102 formed thereon. The substrate 101 may represent any appropriate carrier material, such as a silicon material and the like, wherein at least a portion of the substrate 101 may comprise a crystalline semiconductor material 101A, which may also be referred to as substrate material, which in combination with the semiconductor layer 102 may thus form a bulk configuration with the semiconductor layer 102, at least in an initial state. That is, the semiconductor layer 102 may comprise a plurality of active regions 102B, which are to be understood as semiconductor regions in which appropriate PN junctions may have to be formed for one or more transistors. Thus, in a bulk configuration, the active regions 102B may directly connect, in a mechanical sense, to the crystalline substrate material 101A, while a corresponding electrical separation, if required, may be provided on the basis of any appropriate doping profile in the semiconductor layer 102. Consequently, in a corresponding bulk configuration, the active region 102B may be efficiently thermally coupled to the crystalline material 101A and thus to the substrate 101, which may provide superior performance with respect to heat dissipation in sophisticated semiconductor devices. As explained above, the semiconductor layer 102 may be provided in the form of any appropriate semiconductor material, wherein, in some illustrative embodiments, a silicon material may be provided which, however, may comprise other components, such as dopants and the like. Moreover, the semiconductor layer 102 may comprise, in addition to the active regions 102B, which may be understood as being comprised of a semiconductor base material of the layer 102, a semiconductor region 102A, which may be embedded and which may thus be in direct contact with the semiconductor base material of the semiconductor layer 102, while, in other cases (not shown), an additional material, such as a dielectric material, may separate the semiconductor region 102A from the base material of the layer 102. The semiconductor region 102A may be comprised of any appropriate semiconductor material so as to provide a reduced heat conductivity compared to the semiconductor base material or active region 102B so that an electronic fuse may be efficiently formed within the semiconductor region 102A, as is also discussed above. Consequently, the region 102A may also be referred to as a fuse region and may receive a metal silicide or any other semiconductor/metal compound that is appropriate for inducing a desired electromigration effect, as explained above. For example, a silicon/germanium material mixture may have a significantly reduced heat conductivity compared to a substantially pure silicon material, except for any dopants and the like, thereby providing an efficient thermal decoupling of the fuse region 102A with respect to the semiconductor layer 102 and the substrate material 101A. For example, the fuse region 102A may be provided in the form of a substantially crystalline silicon/ germanium mixture or alloy when, for instance, the region 102A may directly connect to the crystalline substrate material 101A and/or to the base material of the semiconductor layer 102. In other cases, as will be described later on in more detail, the region 102A may be provided in the form of a polycrystalline region or a substantially amorphous region, when an additional dielectric material may be provided so as to separate the region 102A from the crystalline substrate material 101A and the semiconductor layer 102.

The semiconductor device 100 as illustrated in FIG. 1a may be formed on the basis of the following processes. At any appropriate manufacturing stage, i.e., prior to or after providing the active regions 102B in the semiconductor layer 102, for instance by forming appropriate isolation structures, such as shallow trench isolations and the like, a portion of the semiconductor layer 102 corresponding to the semiconductor or fuse region 102A may be removed, for instance by providing an etch mask and exposing the device 100 to a reactive etch ambient, such as a plasma-assisted etch process and the like, for which a plurality of efficient etch recipes are available, for instance for etching silicon material selectively to a plurality of dielectric materials and resist materials. The corresponding etch mask may be formed on the basis of a lithography mask that may thus define the lateral position and size of the region 102A so as to obtain the desired lateral and vertical thermal decoupling of the region 102A when forming an electronic fuse therein. That is, the lateral dimensions of the etch mask may be selected such that an electronic fuse of appropriate configuration may be formed within the region 102A, while at the same time providing the desired lateral thermal resistance with respect to the surrounding semiconductor material of the layer 102. As will be explained later on in more detail, if desired, an additional dielectric material may be provided so as to further enhance the thermal separation or decoupling of the region 102A from the surrounding material. Similarly, during the etch process, an appropriate depth and thus height or thickness of the semiconductor region 102A may be adjusted so as to obtain the desired thermal decoupling in the vertical direction for an electronic fuse to be formed in the region 102A.

After forming a corresponding cavity or recess, a semiconductor material, such as a silicon/germanium material, may be deposited, for instance, by an epitaxial growth process, thereby forming a crystalline material if the region 102A is in direct contact with the crystalline substrate material 101A and/or the crystalline material of the semiconductor layer 102. In other cases, any other appropriate deposition technique may be applied in which the semiconductor material, such as the silicon/germanium material, may be provided in a polycrystalline state or in an amorphous state, for instance when forming a dielectric material prior to depositing the semiconductor material. Thereafter, any excess material may be removed, for instance, by a polishing process and the like. In other illustrative embodiments, the deposition of the semiconductor material may be accomplished on the basis of a deposition mask, for instance in the form of a dielectric material and the like, wherein a selective epitaxial growth process may be applied so as to deposit the semiconductor material substantially exclusively on exposed areas of the crystalline substrate material 101A and/or the material of the semiconductor layer 102, while a significant material deposition on dielectric surface areas may be efficiently suppressed. To this end, a plurality of well-established selective epitaxial growth strategies for silicon/germanium are available and may be used. Furthermore, if desired, during the deposition of the semiconductor material, any appropriate dopant species may be incorporated, if required, so as to adjust the basic conductivity of the semiconductor material in the region 102A.

Figure 1B:
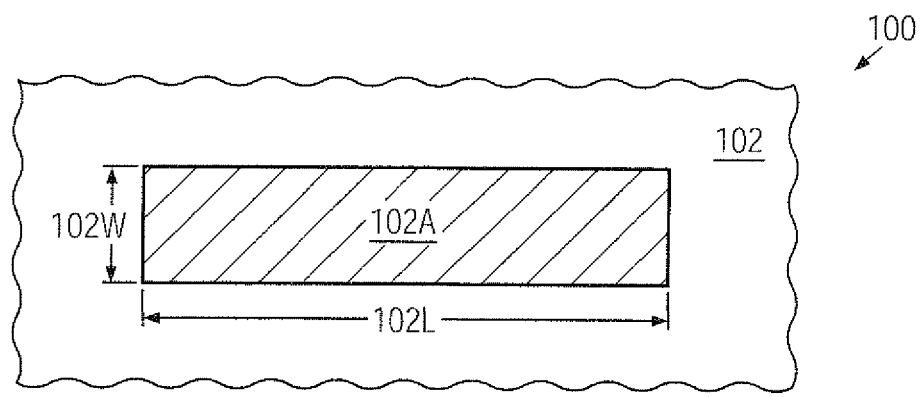

FIG. 1b schematically illustrates a top view of the device 100. As shown, the fuse region 102A may have a desired width 102W and a desired length 102L, which may be selected so as to accommodate an electronic fuse and provide sufficient thermal decoupling with respect to the surrounding materials, such as the semiconductor layer 102. It should be appreciated that, based on a silicon/germanium semiconductor material, similar electronic characteristics as for a polysilicon-based electronic fuse may be achieved, thereby enabling similar designs and layouts for an electronic fuse to be provided within the fuse region 102A.

Thereafter, the processing may be continued on the basis of any appropriate process strategy. At an appropriate manufacturing stage, a mask may be applied so as to define the size and position of an electronic fuse within the fuse region 102A.

Figure 1C:
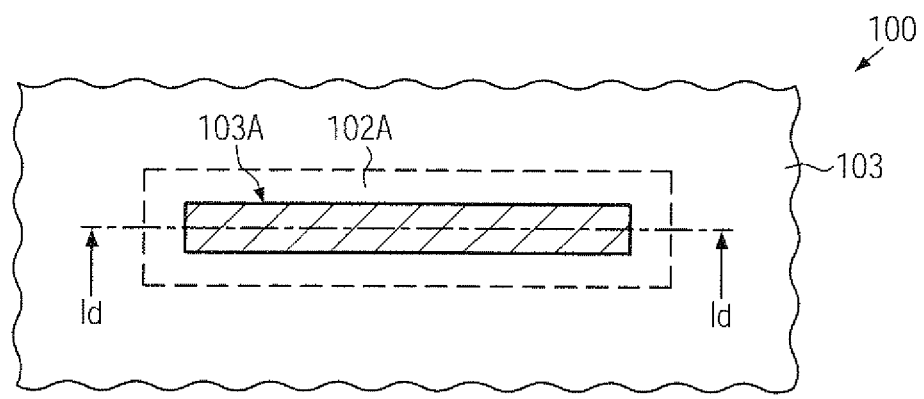
FIG. 1c schematically illustrates a top view of the semiconductor device in a further advanced manufacturing stage in which a silicidation mask may be provided so as to define contact areas and the actual fuse area within the semiconductor material of reduced heat conductivity, according to illustrative embodiments.

FIG. 1c schematically illustrates a top view of the semiconductor device 100 when a mask 103, such as a silicidation mask or silicide blocking mask, may be provided to define the lateral position and size of an electronic fuse by providing an appropriate mask opening 103A, which may thus expose a corresponding portion of the fuse region 102A. The mask 103 may be provided in the form of any appropriate dielectric material, such as silicon nitride, silicon dioxide and the like. To this end, well-established deposition processes, such as plasma enhanced chemical vapor deposition (CVD) and the like, may be applied.

Figure 1D:
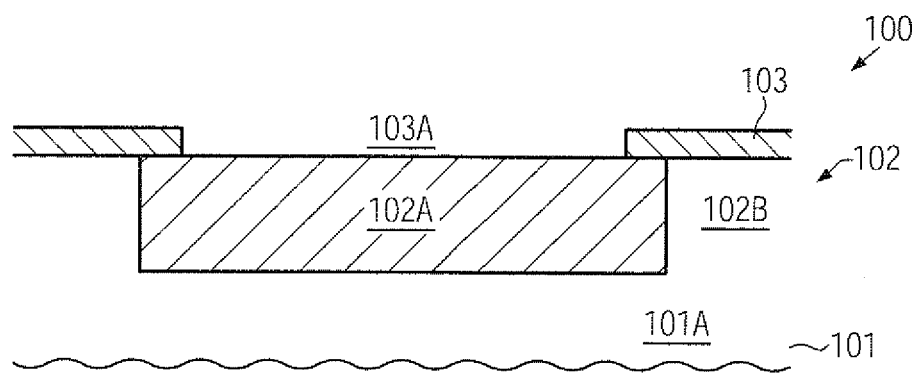
FIG. 1d schematically illustrates a cross-sectional view of the semiconductor device including the silicidation mask.

FIG. 1d schematically illustrates a cross-sectional view of the device 100 according to the line Id of FIG. 1c. Thus, the mask opening 103A may expose a portion of the fuse region 102A in which a metal/semiconductor compound, for instance a metal silicide, is to be formed in the material 102A. It should be appreciated that the mask 103 may be provided prior to forming any other metal silicides in the semiconductor device 100, for instance in corresponding transistor elements and the like. Consequently, in this case, a metal silicide may be formed in the fuse region 102A together with any other metal silicides in other device areas, without requiring additional process steps.

Figure 1E:
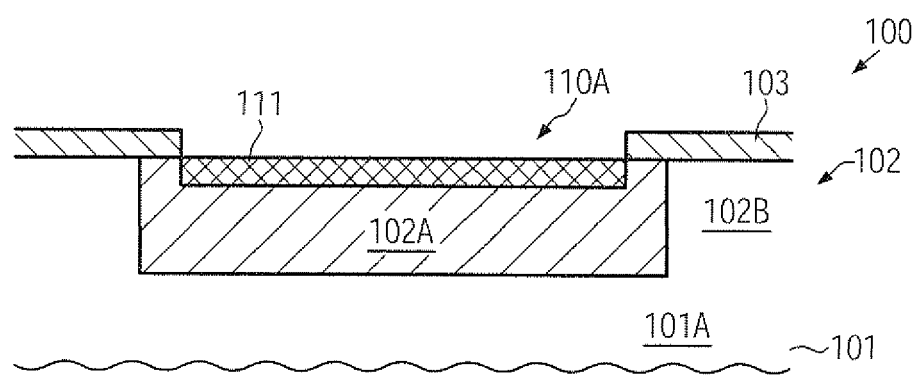
FIGS. 1e-1f schematically illustrate a cross-sectional view and a top view, respectively, of the semiconductor device in a further advanced manufacturing stage in which a metal silicide may be provided in the semiconductor material of reduced heat conductivity, according to illustrative embodiments.

FIG. 1e schematically illustrates the semiconductor device 100 in a further advanced manufacturing stage in which a metal silicide 111 may be formed in and on the fuse region 102A, thereby providing an electronic fuse 110A. It should be appreciated that the electronic fuse 110A comprises the metal silicide 111 and also a portion of the semiconductor material in the fuse region 102A, wherein, however, as explained above, the essential mechanism for providing a fuse configuration may be seen in the electromigration effect within a portion of the metal silicide material 111, even if a certain current flow may also be established within the semiconductor material of the region 102A surrounding the metal silicide material 111. The metal silicide material 111 may be formed on the basis of any appropriate silicidation technique, for instance by depositing a refractory metal, such as nickel, cobalt, platinum and the like, depending on the overall device requirements and by performing a heat treatment so as to initiate a chemical reaction with the silicon species in the fuse region 102A and in other device areas, such as transistors and the like, comprising exposed portions of the semiconductor layer 102. Thereafter, any non-reacted metal formed on dielectric surface areas, such as the mask 103, may be removed selectively with respect to the metal silicide material 111, which may be accomplished on the basis of any well-established process strategies. If required, any additional heat treatments may be performed so as to thermally stabilize the metal silicide material 111. It should be appreciated that, generally, the degree of metal/silicon interdiffusion may be less pronounced in the region 102A compared to a substantially pure silicon material of the semiconductor layer 102, thereby resulting in a reduced thickness of metal silicide 111 compared to a metal silicide that may be formed on the basis of an exposed portion of the semiconductor layer 102. Consequently, a desired high current density may be established within the metal silicide 111 on the basis of a reduced total current compared to a metal silicide formed in a silicon material on the basis of the same process parameters.

Figure 1F:
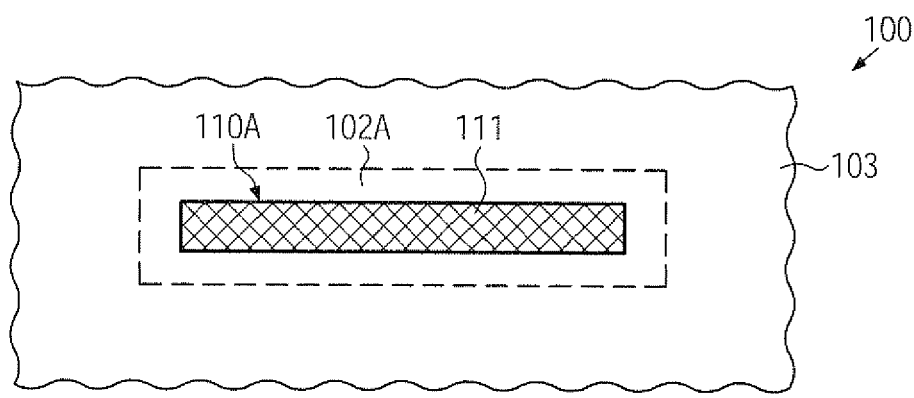

FIG. 1f schematically illustrates a top view of the device 100. As illustrated, the electronic fuse 110A, as discussed above, substantially defined by the metal silicide material 111, may be positioned within the fuse region 102A, wherein the remaining semiconductor material of the region 102A may thus provide an increased thermal resistance and thus a superior thermal decoupling from the surrounding material of the layer 102 (FIG. 1e), while also efficiently vertically decoupling the metal silicide material 111 from the crystalline substrate material 101A (FIG. 1e).

Figure 1G:
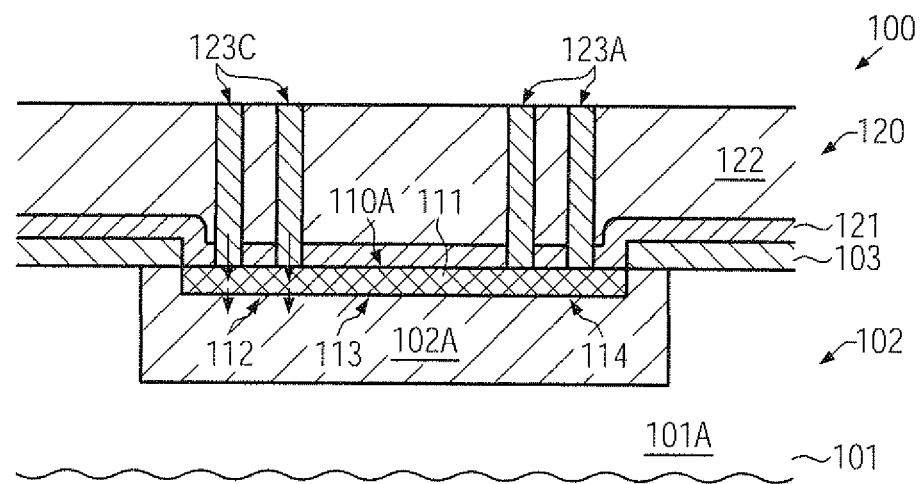
FIG. 1g schematically illustrates a cross-sectional view of the semiconductor device in a further advanced manufacturing stage in which contact elements may connect to contact areas of the electronic fuse, according to illustrative embodiments.

FIG. 1g schematically illustrates the semiconductor device 100 in a further advanced manufacturing stage. As illustrated, a contact level 120 may be formed above the semiconductor layer 102 and may comprise any appropriate dielectric material, such as the first dielectric material 121, such as silicon nitride, followed by a second dielectric material 122, such as silicon dioxide, which are frequently used dielectric materials for contact levels of complex semiconductor devices. Furthermore, the contact level 120 may comprise contact elements 123C, 123A which may extend through the dielectric materials 122, 121 and may connect to the electronic fuse 110A. As shown, the contact elements 123C may extend to a contact area 112 of the electronic fuse 110A and may thus represent a portion of the metal silicide material 111 so as to establish therein a desired high current density. Similarly, the contact elements 123A may connect to a second contact area 114 of the metal silicide material 111, while an intermediate area, also referred to as fuse area 113, may represent the area in which may result a significant line deterioration, i.e., a current flow induced material migration, which may also be strongly influenced by local temperature, as explained above, thereby enabling the generation of a high impedance state of the electronic fuse 110A. In the embodiment shown, the contact elements 123C may represent the cathode, since here an electron flow may be established within the metal silicide material 111 in a direction as indicated by the arrows, wherein the contact elements 123C and the contact area 112 may have any appropriate configuration so as to establish the desired current flow through the actual fuse area 113. It should be appreciated that a certain current flow may also be established with the semiconductor material of the region 102A adjacent to the metal silicide material 111, however with reduced density, wherein, however, nevertheless, a pronounced heat generation may be initiated in this area due to the high resistance value of the material 102A with respect to the metal silicide material 111. Consequently, superior local temperature conditions may be established along and within the fuse area 113, thereby contributing to a superior electromigration effect. Similarly, the anode contact elements 123A may have any appropriate configuration as required for conducting the desired high current density to the fuse area 113.

The contact level 120 may be formed on the basis of any desired process strategy, for instance, by depositing the material 121 followed by the material 122 based on plasma enhanced CVD techniques, sub-atmospheric CVD and the like, followed by the planarization of the resulting material layer stack, which may then be patterned on the basis of sophisticated lithography techniques. Thereafter, the corresponding openings may be filled with an appropriate conductive material, such as tungsten and the like, so as to provide the contact elements 123C, 123A. At the same time, corresponding contact elements may be provided in other device areas, for instance so as to connect to transistor elements and the like.

Figure 1H:
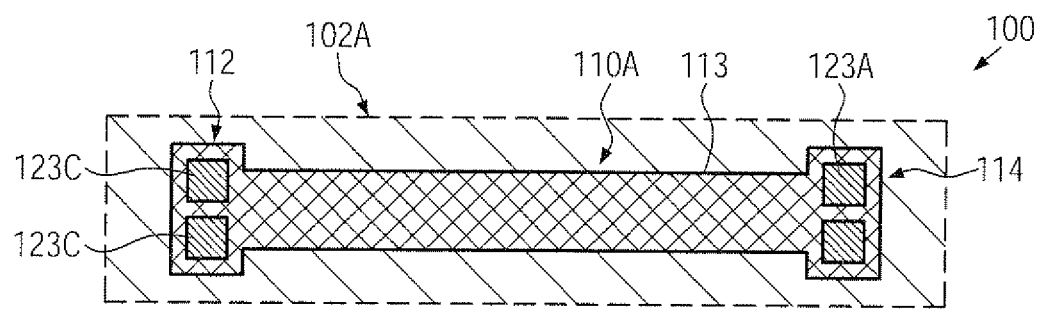
FIG. 1*h* schematically illustrates a top view of the semiconductor device according to a further illustrative embodiment in which contact heads may be provided for connecting to the electronic fuse.

FIG. 1*h* schematically illustrates a top view of the semiconductor device 100, wherein the electronic fuse may have pronounced contact areas 112, 114, which may also be referred to as fuse heads, so as to provide an increased area for establishing the current flow within the fuse area 113, however without requiring an increased overall length of the electronic fuse 110A. It should be appreciated that generally the electronic fuse 110A may have any desired geometric configuration, for instance a plurality of angled portions may be provided for the fuse area 113, so as to provide a reduced lateral dimension in one direction, if considered appropriate. For example, any geometric layouts and designs may be used as may also typically be used in polysilicon-based electronic fuses and/or in electronic fuses formed in the active semiconductor material of SOI devices, since, in total, quite similar electronic characteristics may be obtained by means of the thermal decoupling of the electronic fuse 110A within the fuse region 102A.

Figure 1I:
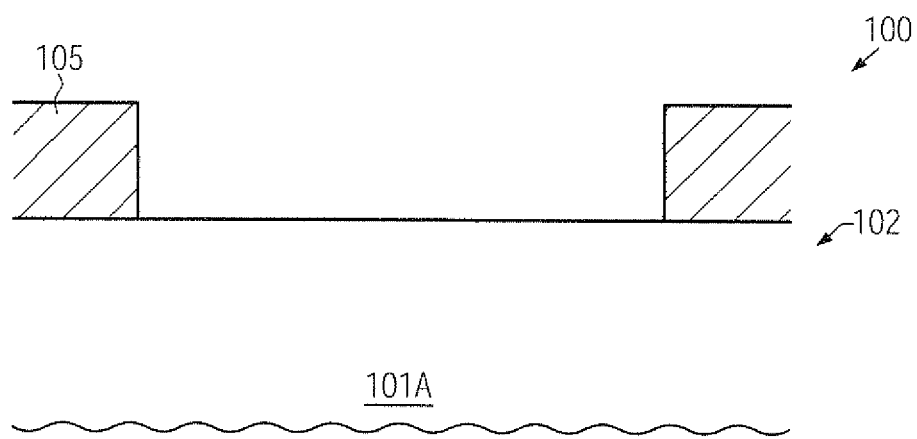
FIGS. 1*i*-1*j* schematically illustrate cross-sectional views of the semiconductor device in a manufacturing stage in which a semiconductor material of reduced heat conductivity may be provided within the semiconductor base material, according to illustrative embodiments.

FIG. 1*i* schematically illustrates the semiconductor device 100 in an early manufacturing stage. As illustrated, a mask 105 may be provided above the semiconductor layer 102 in order to define the lateral position and size of the fuse region within the semiconductor layer 102. In one illustrative embodiment, the mask 105 may be provided in the form of a resist material, which may act as an etch mask or an implantation mask, depending on the further process strategy. For example, in one illustrative embodiment, the mask 105 may be used as an implantation mask so as to incorporate an appropriate species, such as oxygen, nitrogen and the like, so as to significantly modify the thermal conductivity of the base material of the layer 102 while nevertheless enabling the formation of a metal silicide in a later manufacturing stage. For example, 0.5-1.0 percent or more of oxygen and/or nitrogen may be incorporated into the exposed portion of the material 102, which may be accomplished on the basis of appropriately selected implantation parameters, thereby reducing the thermal and electrical conductivity of the material 102 down to a desired depth.

In other illustrative embodiments, the mask 105 may be used as an etch mask for forming a recess or cavity in the layer 102, the depth of which may be selected so as to obtain the desired vertical thermal decoupling, as is also previously discussed.

Figure 1J:
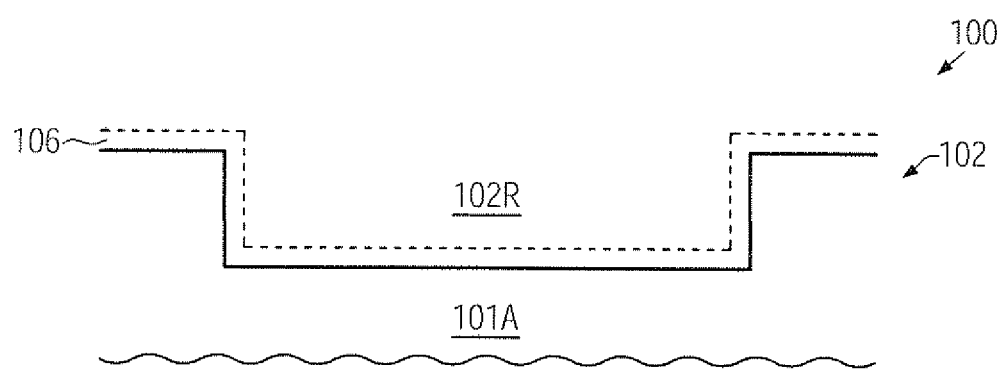

FIG. 1*j* schematically illustrates the device 100 in an advanced manufacturing stage, i.e., after forming a recess 102R and after removing the etch mask 105 (FIG. 1*i*). Moreover, in some illustrative embodiments, an additional decoupling layer 106 may be provided, for instance in the form of a dielectric material, such as silicon dioxide, silicon nitride and the like. To this end, any appropriate deposition technique may be applied so as to provide the material 106 with a desired material composition and layer thickness. For example, silicon dioxide with a thickness of 10-100 nm or even more may be formed on the basis of well-established CVD techniques. Next, an appropriate semiconductor material, such as silicon/germanium and the like, may be deposited in the form of an amorphous or polycrystalline material, depending on the overall deposition conditions, wherein any excess material may be removed on the basis of etch techniques, chemical mechanical polishing (CMP) and the like, wherein the material 106 may be used as an efficient etch stop material outside the recess 102R. Thereafter, the material 106 may be removed on the basis of any appropriate etch process and the further processing may be continued, as is also previously described. Consequently, upon providing the material 106, a superior thermal decoupling may be achieved with respect to the semiconductor layer 102 in the lateral direction and also with respect to the substrate material 101A in the vertical direction.

Figure 1K:
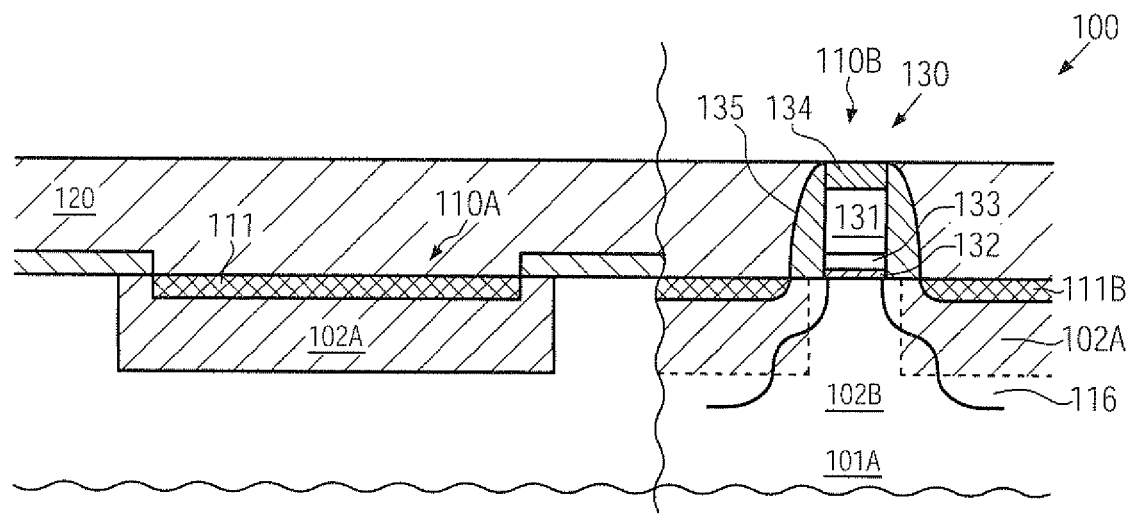
FIGS. 1*k*-1*l* schematically illustrate cross-sectional views of the semiconductor device according to still further illustrative embodiments in which sophisticated transistor elements may be formed on the basis of a replacement gate approach in combination with a semiconductor-based electronic fuse provided in the active semiconductor layer of the semiconductor device.

FIG. 1*k* schematically illustrates the semiconductor device 100 according to further illustrative embodiments. As illustrated, the electronic fuse 110A may be formed within the fuse region 102A, as previously discussed, while a transistor 110B may be formed in and above the active region 102B. In the manufacturing stage shown, the transistor 110B may comprise drain and source regions 116 formed in the active region 102B and may comprise metal silicide regions 111B, which may differ in thickness and overall composition due to the difference between the semiconductor materials in the active region 102B and the fuse region 102A, as previously discussed. Furthermore, in some illustrative embodiments, a strain-inducing semiconductor material may be provided in the active region 102B and may be comprised of a silicon/germanium alloy or mixture, which may have substantially the same composition as the semiconductor material in the region 102A. In this case, the metal silicides 111 and 111B may have substantially the same configuration due to the similarity of the corresponding base semiconductor materials 102A. Moreover, the transistor 110B may comprise a gate electrode structure 130 which in turn may comprise a gate dielectric material 132, such as a conventional dielectric material, a dielectric material comprising a high-k dielectric component and the like. Moreover, a placeholder electrode material 131, such as polysilicon, may be formed above the gate dielectric material 132. In some illustrative embodiments, a metal-containing cap material 133 may be formed on the gate dielectric material 132 when comprising a high-k dielectric material. Moreover, a dielectric cap layer 134 may be provided above the placeholder material 131 and may be used for preventing the formation of a metal silicide in the material 131. Additionally, a sidewall spacer structure 135 may be provided so as to adjust the lateral dopant profile of the drain and source regions 116 and a lateral offset of the metal silicide regions 111B. Moreover, a portion of the dielectric material of the contact level 120 may be provided, for instance in the form of silicon dioxide or a combination of silicon nitride and silicon dioxide.

The device 100 may be formed in accordance with any appropriate process strategy. In some illustrative embodiments, the gate electrode structure 130 may be formed after adding the fuse region 102A, which may involve the deposition of the materials 132, 133, 131 and 134 and the patterning thereof on the basis of sophisticated lithography and etch techniques. In other illustrative embodiments, the fuse region 102A may be formed after forming the gate electrode structure 130, for example if a same type of semiconductor material may have to be provided within the active region 102B, which may be accomplished by forming recesses in the active region 102B together with a recess that may correspond to the fuse region 102A of the electronic fuse 110A. Thereafter, the recesses may be refilled by a selective epitaxial growth process and thereafter the further processing may be continued by forming the drain and source regions 116 in combination with the spacer structure 135. After completing any anneal processes, the metal silicide materials 111, 111B may be formed, as is also discussed above. Thereafter, the dielectric material of the contact level 120 may be deposited and may be planarized so as to finally expose the material 131 of the gate electrode structure 130.

Figure 1L:
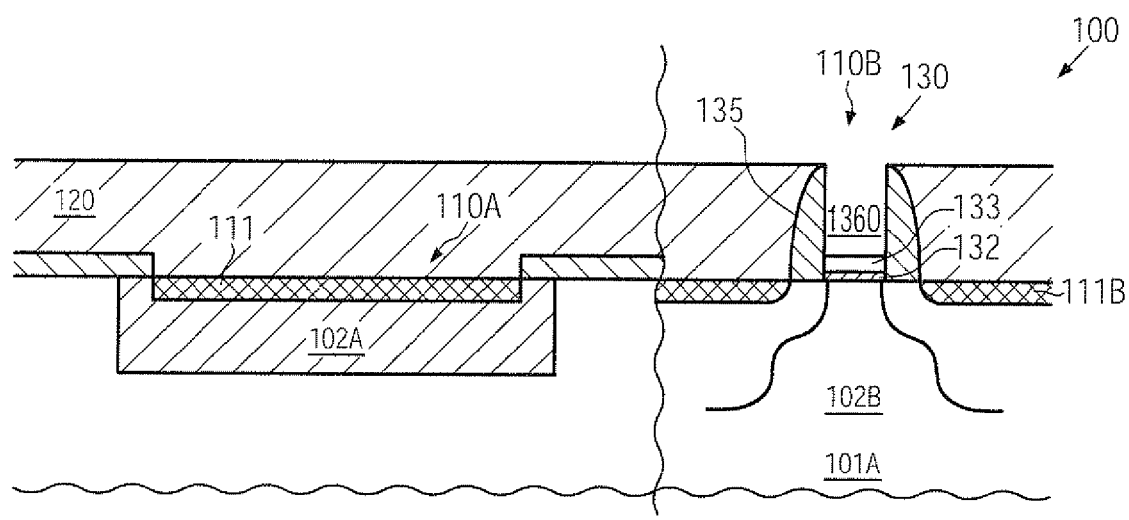

FIG. 1*l* schematically illustrates the semiconductor device 100 in a further advanced manufacturing stage. As shown, the placeholder material 131 (FIG. 1*k*) may be removed on the basis of any appropriate selective etch technique without affecting the electronic fuse 110A. It should be appreciated that, depending on the process strategy, the material 132 may also be removed if a high-k dielectric material is still to be provided within a gate opening 1360, while, in other cases, the high-k dielectric material may be incorporated in the layer 132 and may be protected by the conductive cap layer 133 during the removal of the material 131 (FIG. 1k). Thereafter, any appropriate material is formed, such as a metal-containing electrode material for adjusting the work function of the gate electrode structure 130 and providing the desired conductivity so as to form a sophisticated high-k metal gate electrode structure on the basis of a replacement gate approach.

As a result, the present disclosure provides semiconductor devices and manufacturing techniques in which electronic fuses may be formed in the active semiconductor material of a semiconductor device having a bulk configuration, wherein an undue heat dissipation capability of the bulk configuration may be reduced by providing a semiconductor material of reduced heat conductivity. Consequently, the electronic characteristics of the electronic fuses may be adjusted on the basis of a semiconductor material in combination with a semiconductor/metal compound, such as a metal silicide, without being affected by any process strategies for forming other circuit features, such as complex high-k metal gate electrode structures, which may be provided on the basis of a replacement gate approach. Consequently, well-established layouts and design criteria for semiconductor-based electronic fuses may be applied in sophisticated semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an electronic fuse of a semiconductor device, the method comprising:
   replacing a portion of a first semiconductor material with a second semiconductor material, said first semiconductor material forming a bulk configuration with a substrate material of said semiconductor device, said first semiconductor material having a first heat conductivity that is greater than a second heat conductivity of said second semiconductor material;
   forming a mask so as to define lateral dimensions of said electronic fuse in said second semiconductor material; and
   forming a metal silicide material of said electronic fuse by using said mask as a silicidation mask.

2. The method of claim 1, wherein said second semiconductor material comprises a silicon/germanium mixture.

3. The method of claim 1, wherein said first semiconductor material is comprised of silicon and said second semiconductor material is a silicon-containing semiconductor material that is different than said first semiconductor material, wherein replacing said portion of said first semiconductor material with said second semiconductor material comprises forming a recess in said first semiconductor material and filling said recess with said silicon-containing semiconductor material.

4. The method of claim 3, wherein filling said recess with said silicon-containing semiconductor material comprises forming a crystalline form of said silicon-containing semiconductor material by performing an epitaxial growth process.

5. The method of claim 3, wherein filling said recess with said silicon-containing semiconductor material comprises forming one of an amorphous and a polycrystalline form of said silicon-containing semiconductor material in said recess.

6. The method of claim 1, wherein forming said metal silicide comprises forming said metal silicide so as to be within said second semiconductor material.

7. The method of claim 6, wherein forming said metal silicide further comprises providing a first contact area, a second contact area and a fuse area laterally positioned between said first and second contact areas.

8. The method of claim 7, wherein at least one of said first contact area or said second contact area has an increased width compared to said fuse area.

9. A method of forming a semiconductor device, the method comprising:
   reducing a heat conductivity of a semiconductor base material locally in a fuse region, said fuse region forming a bulk configuration with said semiconductor base material, wherein reducing said heat conductivity of said semiconductor base material comprises replacing said semiconductor base material in said fuse region with a semiconductor material of reduced heat conductivity;
   forming a silicide mask layer above said semiconductor base material, said silicide mask layer exposing a portion, but not all, of said semiconductor material having said reduced heat conductivity; and
   performing a silicidation process through said silicide mask to form a metal silicide material in said exposed portion of said semiconductor material within said fuse region so as to provide a first contact area, a second contact area and an intermediate fuse area of an electronic fuse.

10. The method of claim 9, wherein said semiconductor material having said reduced heat conductivity is comprised of a silicon-containing semiconductor material and wherein replacing said semiconductor base material of said fuse region comprises forming a cavity in said semiconductor base material and refilling said cavity with a silicon-containing semiconductor material.

* * * * *